United States Patent
Sengoku

(10) Patent No.: US 12,413,382 B2
(45) Date of Patent: Sep. 9, 2025

(54) MODIFIED MANCHESTER ENCODING FOR ULTRA-LOW POWER INTERFACES

(71) Applicant: Apple Inc., Cupertino, CA (US)

(72) Inventor: Shoichiro Sengoku, Dublin, CA (US)

(73) Assignee: Apple Inc., Cupertino, CA (US)

( * ) Notice: Subject to any disclaimer, the term of this patent is extended or adjusted under 35 U.S.C. 154(b) by 74 days.

(21) Appl. No.: 18/360,378

(22) Filed: Jul. 27, 2023

(65) Prior Publication Data

US 2024/0039687 A1 Feb. 1, 2024

Related U.S. Application Data

(60) Provisional application No. 63/370,039, filed on Aug. 1, 2022.

(51) Int. Cl.
*H04L 27/10* (2006.01)
*H03L 7/08* (2006.01)
*H04L 7/00* (2006.01)

(52) U.S. Cl.
CPC .......... *H04L 7/0037* (2013.01); *H03L 7/0807* (2013.01)

(58) Field of Classification Search
CPC . H04L 7/0037; H04L 25/4904; H03L 7/0807; H04B 10/116

USPC .......................................... 375/282, 361, 333
See application file for complete search history.

(56) References Cited

U.S. PATENT DOCUMENTS

| | | | |
|---|---|---|---|
| 5,267,269 A * | 11/1993 | Shih | H04L 25/4904 375/296 |
| 5,805,632 A * | 9/1998 | Leger | H04L 25/4904 360/41 |
| 2019/0132000 A1 * | 5/2019 | Kim | H04B 10/116 |

* cited by examiner

*Primary Examiner* — Phuong Phu
(74) *Attorney, Agent, or Firm* — Blank Rome LLP

(57) ABSTRACT

The present disclosure relates generally to an interface between a host processor device and a peripheral device, such as a camera or sensor, and, more particularly, to improving the generation of data signals with embedded clock information to be more rate-flexible and power efficient. Improved techniques are described herein to embed a clock signal into a data signal (e.g., to minimize the number of channels needed)—while allowing for a variable link rate and avoiding the need for a phase lock loop (PLL) and/or long link training times at the receiver, which can consume large amounts of power and on-chip area. In some embodiments, a modified Manchester encoding scheme, e.g., using a fixed delay for its mid-bit transitions (and wherein the delay is independent of link rate), is used to achieve the dual aims of rate flexibility and power efficiency for an improved data signal interface with embedded clock information.

14 Claims, 9 Drawing Sheets

MODIFIED MANCHESTER ENCODING FOR ULTRA-LOW POWER INTERFACES

CROSS-REFERENCE TO RELATED APPLICATIONS

This application claims priority to the commonly-assigned U.S. Provisional Patent Application Ser. No. 63/370,039 ("the '039 application"), entitled, "Improved Manchester Encoding," and filed Aug. 1, 2022.

TECHNICAL FIELD

The present disclosure relates generally to an interface between a host processor and a peripheral device, such as a camera or sensor, and, more particularly, to improving the generation of data signals with embedded clock information to be more rate-flexible and power efficient.

BACKGROUND

Manufacturers of mobile devices, such as cellular phones, may obtain components of the mobile devices from various sources, including different manufacturers. For example, an application processor in a cellular phone may be obtained from a first manufacturer, while the display for the cellular phone may be obtained from a second manufacturer. The application processor and a display or other device may be interconnected using a standards-based or proprietary physical interface. For example, a display may provide an interface that conforms to the D-PHY standard specified by the Mobile Industry Processor Interface Alliance (MIPI). The D-PHY is a popular MIPI physical layer standard for Camera Serial Interface (CSI-2) and Display Serial Interface (DSI) protocols. The CSI-2 interface may be used with D-PHY for the Camera (Imager) to Host interface, as a streaming video interface between devices, and in applications outside of mobile devices.

However, the MIPI D-PHY standard requires a dedicated clock lane to provide transmission clock for the receiver to sample data correctly. This additional extra lane—and the two extra wires and pins (i.e., in the case of differential signal)—is a significant design drawback, given the ever-shrinking circuit board and available flex real estate. Also, having an extra lane with a free running clock signal represents extra power consumption, as compared to interface schemes that embed the clock signal into a data lane.

Another common way to embed a clock signal into a data channel is by encoding it with the so-called "8b10b" format, wherein 8 bits of data are transmitted for every 10 bits of information that are transmitted to a receiver (RX). However, this scheme requires the RX to recover the clock and data signals with a phase locked loop (PLL), delay locked loop (DLL), or by oversampling the signal, which results in extra power and area usage in the system.

Embedding clock information into a data lane by transcoding is also an effective way to minimize skew between clock and data signals, as well as to eliminate the necessity of a phase-locked loop (PLL) to recover the clock information from the data signals.

Clock and data recovery (CDR) circuits are decoder circuits that extract data signals (as well as a clock signals) from one or multiple data signals. However, clock recovery from multiple data signals whose state transitions represent clock events often suffers from jitter in its recovered clock signal, e.g., due to inter-lane skew of the data signals and/or glitch signals by intermediate or undeterminable data signal states at data transition times.

Signal refection caused by characteristic impedance mismatch is a cause of overshoot/undershoot at the rising or falling edges of signals. Characteristic impedance mismatch can occur at any branches/stubs or any junction of signal trace (e.g., connectors), and/or at a receiver input that may be terminated with a resistance that does not match with the impedance of the channel.

In situations of "multi-drop," i.e., when multiple devices are connected on the same bus, there may be a savings on the overall numbers of wires and pins in the circuit, but, e.g., due to such overshoot/undershoot caused by reflection at stubs of such multi-drop image transmission channels, it may be more preferable to use a point-to-point connection architecture, even in the case where two hosts never stream data at the same time (such as staggered frame timing).

Also, such CDR circuits typically can only work for one predetermined rate at a time, and they do not allow for the system to dynamically change the data rate as the transmitter (TX) needs. Most such CDR schemes also require sufficient training, in order to lock the PLL/DLL to the link rate at the transition from a bus inactive state to an active transmission state. Both the fixed rate constraint and the link training constraints often result in the need for large amounts of data buffering at the TX end, so as to absorb any difference between a rate the TX is requesting and the actual link rate and not cause there to be an underflow (or overflow) of data. In addition to link training constraints, uneven data generation rate at the transmitter device can occur, especially when such data is processed with a variable length compression scheme (e.g., as in the case of JPEG image compression). Further, almost all non-compressed data transmitted from an image sensor array will require horizontal blanking between any two lines of image data, which also results in an uneven data transmission rate (and which can be ameliorated via the use of data buffers to absorb such uneven data transmission rates).

Traditional so-called "Manchester" encoding defines the timing of the data bit (i.e., the "unit interval" or UI time) to be fixed and for the "mid-bit transition" to occur literally in the middle of the bit period time, such that the oversampling count per-bit period should be near constant—and the mid-bit transitions can be safely ignored. In addition to the need for a fast sampling clock, from this expected constant oversampling count, it is not possible to dynamically change a rate, e.g., to make the data rate faster or slower—a similar constraint that is faced by the aforementioned 8b10b clock embedding scheme.

Thus, what is needed is a way to embed a clock signal into the data signal (e.g., to minimize the number of channels needed)—while allowing for a variable link rate and avoiding the need for a PLL and/or long link training at the receiver, which can both be large power (and area) consumers, and also providing robust immunity to signal spikes at signal transitions.

BRIEF SUMMARY

Various improved ultra-low power interfaces, e.g., utilizing a modified Manchester encoding scheme, are disclosed herein. In some embodiments, an encoder is disclosed, wherein the encoder is configured to encode a data signal into an encoded data signal, the encoded data signal comprising: boundary transitions that indicate a current state of the encoded data signal; and mid-bit transitions that occur between any two consecutive states in the encoded data signal having the same value, wherein the mid-bit transitions occur at a fixed first time-interval after the boundary transitions.

According to some embodiments, the fixed first time-interval is independent of a link rate (i.e., data rate or link speed) of the encoded data signal.

According to some embodiments, the fixed first time-interval is determined to be the shortest possible value for a physical channel that is used for the encoded data signal (e.g., based on the physical channel length, amount of load, etc.).

According to some embodiments, a rate of the encoded data signal is dynamic.

According to some embodiments, the encoder is part of an event camera system.

According to other embodiments, a decoder is disclosed, wherein the decoder is configured to: receive an encoded data signal, the encoded data signal comprising: boundary transitions that indicate a current state of the encoded data signal; and mid-bit transitions that occur between any two consecutive states in the encoded data signal having the same value, wherein the mid-bit transitions occur after a fixed first time-interval after the boundary transitions; generate a non-equal (NE) signal based on a comparison between a current state of the encoded data signal with a state preceding the current state of the encoded data signal; delay the NE signal by a second time interval that is greater than the fixed first time-interval; and sample a state of the encoded data signal using the delayed NE signal.

According to some such embodiments, the decoder further comprises a clock data recovery (CDR) circuit comprising an XOR gate that generates the NE signal.

According to some such embodiments, the decoder further comprises a CDR circuit comprising a delay circuit that delays the NE signal.

According to some such embodiments, the delay circuit comprises an inverter chain.

According to some such embodiments, the decoder further comprises a CDR circuit comprising a flip-flop circuit that stores a state of the encoded data signal and is sampled using the delayed NE signal.

According to some such embodiments, the decoder further comprises a CDR circuit configured to generate a recovered clock signal based on the delayed NE signal.

According to some such embodiments, the CDR circuit is configured to reshape the recovered clock signal to have a constant duty cycle.

According to still other embodiments, a CDR circuit is disclosed, including: a single input for inputting an input signal (MCIN); a level latch that stores the input signal (MCIN) and outputs a stored data (SD) signal; an XOR gate that determines an inequality between the input signal (MCIN) and the SD signal and that outputs a not-equal (NE) signal; a set-reset (S-R) latch that sets (and holds) the NE signal, outputs a noise-filtered version of the NE signal (i.e., a NEFLT signal), and is reset by a delayed version of the NEFLT signal (i.e., a NEFLTD signal); a delay circuit that delays the NEFLT signal and outputs the NEFLTD signal; an OR gate that determines a maximum between the NEFLT signal and the NEFLTD signal, and outputs an EN signal that enables the level latch; and a flip-flop that stores the SD signal and outputs a received data (RXDATA) signal, wherein the flip-flop is sampled by the NEFLT signal.

According to yet other embodiments, a method for decoding a data signal is disclosed, the method comprising: receiving an encoded data signal, wherein the encoded data signal comprises: boundary transitions that indicate a current state of the encoded data signal; and mid-bit transitions that occur between any two consecutive states in the encoded data signal having the same value, wherein the mid-bit transitions occur after a fixed first time-interval after the boundary transitions; ignoring any transitions in the encoded data signal for a period of time long enough not to sense the mid-bit transitions; and sensing states of the encoded data signal based on the boundary transitions.

According to some such embodiments, the method further comprises: generating a clock signal based on sensing the boundary transitions.

According to some such embodiments, each period of time during which any transitions are ignored begins after a boundary transition.

According to some such embodiments, sensing the states of the encoded data signal occurs at an end of a unit interval (UI).

According to some such embodiments, the data signal is encoded by an encoder, and the encoded data signal is transmitted from the encoder to a decoder.

According to some such embodiments, the decoder performs the steps of: generating a NE signal; delaying the NE signal; and sensing states of the encoded data signal using the delayed NE signal.

According to some such embodiments, the encoder is part of an event camera system having an image sensor, and the decoder is part of a system on a chip (SoC).

Various methods, systems, and integrated circuits and/or other non-transitory program storage devices having instructions stored thereon causing one or more processors to perform the techniques described herein are also contemplated by this disclosure.

DETAILED DESCRIPTION

Various improved ultra-low power interfaces are described herein. In some embodiments, an interface comprises an interface between a host processor and a peripheral device, such as a camera or sensor. Embodiments disclosed herein are further directed to improving the generation of data signals with embedded clock information to be more rate-flexible and power efficient.

The improved techniques described herein include techniques to embed a clock signal into a data signal (e.g., to minimize the number of channels needed)—while allowing for a variable link rate and avoiding the need for a phase lock loop (PLL) and/or long link training times at the receiver, which can consume large amounts of power and on-chip area.

Figure 1:
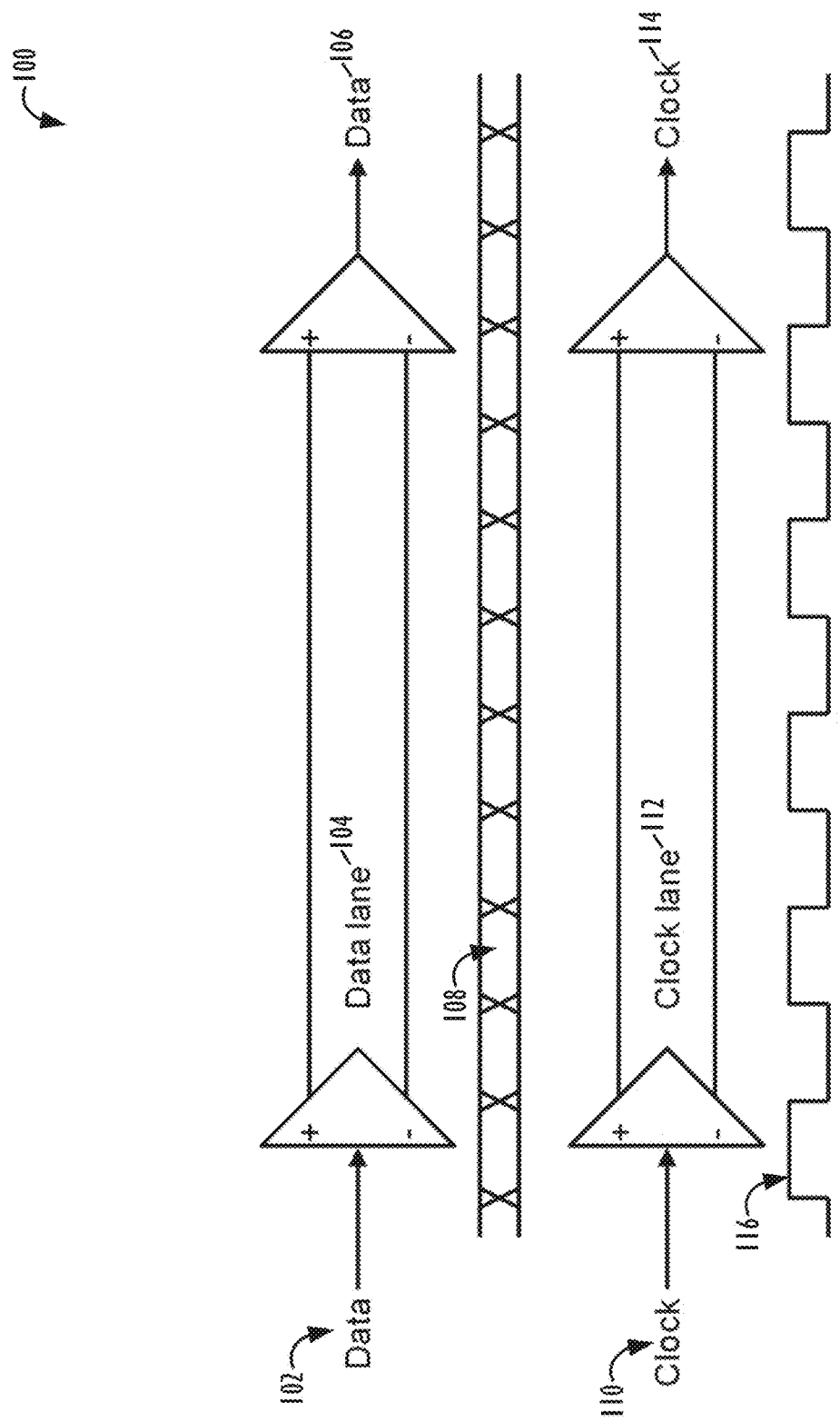
FIG. 1 shows an example of a MIPI D-PHY interface.

In some embodiments, a modified Manchester encoding scheme, e.g., using a fixed delay for mid-bit transitions (and wherein the delay is independent of link rate), is used to achieve the dual aims of rate flexibility and power efficiency for an improved data signal interface with embedded clock information Challenges with Existing Interfaces Turning now to FIG. 1, an example of a MIPI D-PHY interface 100 is shown. A well-known challenge with the MIPI-DPHY standard interface is that it requires a dedicated data lane 104 for the data signal 102, as well as a dedicated clock lane 112 for the clock signal 110 (represented by exemplary waveform 116), in order to provide a transmission clock signal 114 that allows the receiver to sample the data signal 108 correctly (i.e., producing the received data signal at 106).

The additional clock lane 112 leads to the need for the inclusion of two extra wires and pins (i.e., in the case of differential signal) and requires additional space on the circuit board—as well as additional power consumption, i.e., as compared to the interface schemes that are able to embed the clock into a data lane.

Figure 2:
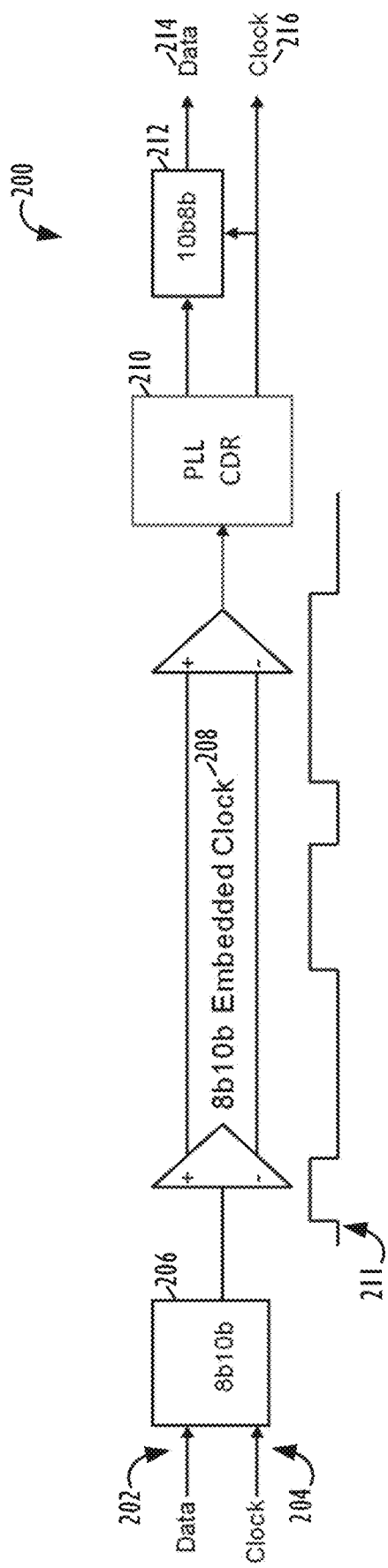
FIG. 2 shows an example of a data channel having an embedded clock signal encoded in the 8b10b format.

Turning now to FIG. 2, an example 200 of a data channel 208 having a clock signal 204 (represented by exemplary waveform 211) embedded in a data signal 202 by an 8b10b encoder 206 is shown. This type of encoding scheme is used by standards, such as VESA DP and MIPI MPHY. As discussed above, according to the 8b10b format, 8 bits of data are transmitted for every 10 bits of information that are transmitted to a RX (e.g., 8-bit words are mapped to 10-bit symbols, while also guaranteeing a sufficient number of state changes to allow for clock signal recovery at the receiver). However, this scheme requires the RX to recover the clock signal 216 and the data signal 214 with a PLL (such as PLL CDR 210), DLL, or by oversampling the signal—and then using a 10b8b decoder 212, which all results in extra power consumption and area usage in the system.

However, CDR circuits (such as PLL CDR 210) typically can only work only for one predetermined rate at a time, and they do not allow for the system to dynamically change the data rate as the transmitter (TX) needs, i.e., they do not allow for flexible and/or irregular clock rates, which may sometimes be desirable in a given system. Most such CDR schemes also require a sufficient amount of up-front training before data transmission, i.e., in order to "lock" the PLL/DLL to the link rate at the transition from a bus inactive state to an active transmission state. Both the fixed rate constraint and the link training constraints often result in the need for large amounts of data buffering at the TX end, so as to absorb any difference between a rate the TX is requesting and the actual link rate and not cause there to be an underflow (or overflow) of data.

Traditional Manchester Encoding

Figure 3:
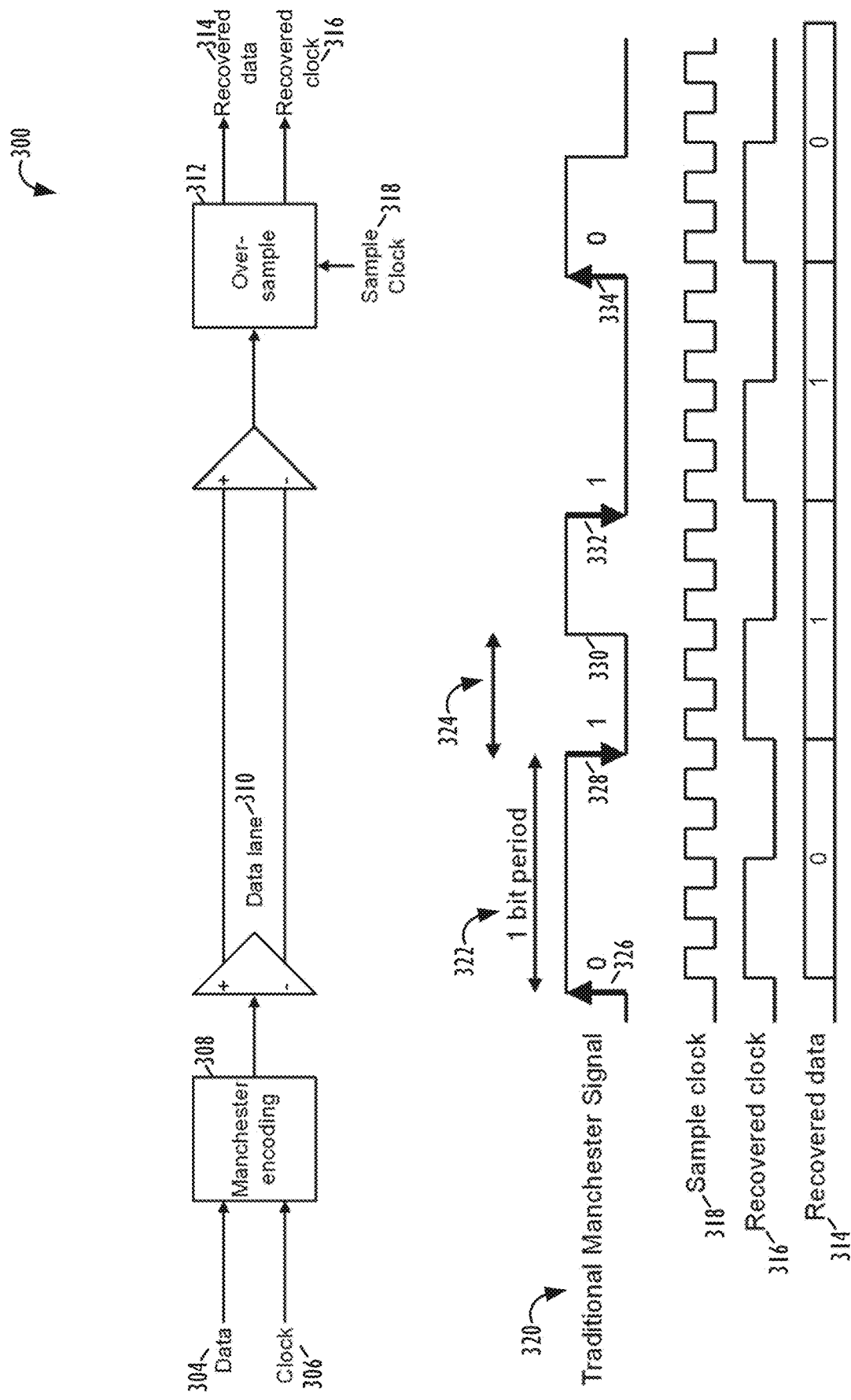
FIG. 3 shows an example of a traditional Manchester encoded signal interface.

Turning now to FIG. 3, an example of a traditional Manchester encoded signal interface 300 is shown. Similar to the interface shown in FIG. 2, example interface 300 comprises a data channel 310 having a clock signal 306 embedded in a data signal 304 by a Manchester encoder circuit 308. However, this scheme requires an oversampling circuit 312 configured to use an oversampling sample clock signal 318 to recover the original clock signal (as shown at 316) and to extract and recover the data signal (as shown at 314).

As described above, traditional Manchester encoding techniques involve defining the timing of the data bit (i.e., the "unit time" or UI) to be fixed and for the "mid-bit transition" (also referred to herein as a "middle toggle" or "preparation toggle") to occur literally in the middle of the bit period time, such that the oversampling count per-bit period should be near constant—and the mid-bit transitions can be safely ignored.

For example, the exemplary traditional Manchester-encoded signal 320 has a defined 1-bit period 322, and resets itself (e.g., if two consecutive bits in the data signal have the same value) at the mid-bit transition, shown by the delay period 324, that is literally half of the length of the 1-bit period 322. In this example, the data bits being transmitted in the signal 320 are a '0' (as shown by the low-to-high transition in the signal at 326), followed by a '1' (as shown by the high-to-low transition in the signal at 328), followed by another '1' (as shown by the high-to-low transition in the signal at 332, following the mid-bit transition to "reset" the signal at 330), followed by a '0' (as shown by the low-to-high transition in the signal at 334), resulting in the recovered data stream 314 of: 0 1 1 0. In this example scheme, the low-to-high transitions in the signal are defined as logical '0' bits, while high-to-low transitions in the signal are defined as logical '1' bits, although it is to be understood that different schemes could be employed and used in different implementations, as desired.

In addition to the need for the fast sampling clock 318, due to the constant oversampling count, it is not possible to dynamically change a rate at which the data is being transmitted, e.g., to make the data rate faster or slower—a similar constraint that is faced by the aforementioned 8b10b clock embedding scheme of FIG. 2.

Modified Manchester Encoding

Figure 4A:
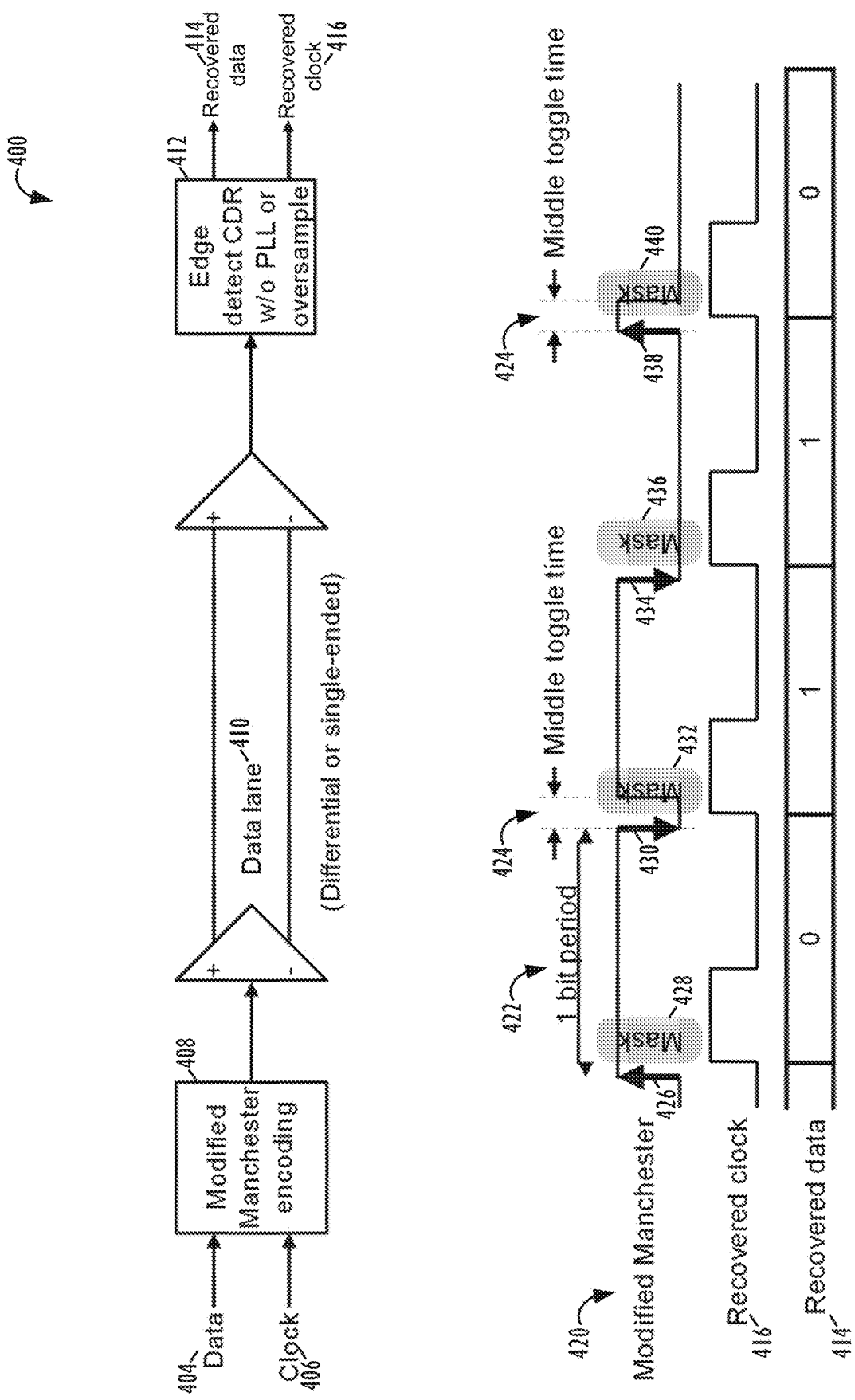
FIG. 4A shows an example of a modified Manchester encoded signal interface, according to some embodiments.

Turning now to FIG. 4A, an example 400 of a modified Manchester encoded signal interface is shown, according to some embodiments. Similar to FIG. 3, example interface 400 comprises a data channel 410 having a clock signal 406 embedded in a data signal 404, encoded by a modified Manchester encoder circuit 408, as will be described in greater detail herein. However, interface 400 does not require the oversampling circuit 312 of FIG. 3 (or the PLL 210 of FIG. 2). Instead, interface 400 utilizes an edge-detection CDR 412 (as will be described in greater detail herein) to recover the original clock signal (as shown at 416) and to extract and recover the data signal (as shown at 414).

As illustrated in FIG. 4A, the signal timing from the traditional Manchester encoding scheme (e.g., as shown in FIG. 3) has been redefined in an advantageous way, such that mid-bit transitions (also referred to herein as the "middle toggle" or "preparation toggle") occur at a fixed time interval after the boundary transitions between the bit periods 422. In other words, the middle toggles occur (if necessary) within the middle toggle time period 424, as shown in FIG. 4A. According to some embodiments, the RX may be configured in such a way as to "mask out" the time periods during which the middle toggles may occur, i.e., such that the incoming data is not sampled until a safe amount of time after such middle toggles have occurred (see, e.g., mask period 432 and 440 in FIG. 4A, during which middle toggles of the modified Manchester-encoded signal 420 occur in order to reset the signal for the next data bit transition encoded in the signal 420.

To illustrate the example of FIG. 4A further, the exemplary modified Manchester-encoded signal 420 has a flexible bit period 422, and resets itself (e.g., if two consecutive bits in the data signal have the same value) during the fixed middle toggle period 424, which occurs after each new data bit is transmitted. In this example, the data bits being transmitted in the signal 420 are a '0' (as shown by the low-to-high transition in the signal at 426), a masking period 428 during which no middle toggle is needed, followed by a '1' (as shown by the high-to-low transition in the signal at 430), a middle toggle at 432, followed by another '1' (as shown by the high-to-low transition in the signal at 434), a masking period 436 during which no middle toggle is needed, followed by a '0' (as shown by the low-to-high transition in the signal at 438), followed by another middle toggle at 440 (indicating that the next data bit, not shown, will also be a '0'), resulting in the recovered data stream 414 of: 0 1 1 0.

The middle toggles in the example of interface 400 occur with a fixed delay from the leading data bit edge (plus or minus the relevant Process, Voltage, and Temperature (PVT) margins) regardless of data link rate. In some embodiments, the fixed delay may be defined to be the shortest possible delay for the targeted physical channel, such that the RX CDR can successfully recover the data signal.

As may now be appreciated, the interface 400 achieves this data transfer without using a PLL, DLL, or oversampling the input data signal. Instead, by ignoring or "masking" out the middle toggle, e.g., with a delay circuit, the RX may recover the clock signal by detecting the leading edge (falling or rising) of the incoming signal. This type of improved modified Manchester encoding scheme results in: a small CDR circuit (one example of which will be described with reference to FIG. 5), no free-running PLL at the RX, zero latency (i.e., no data link training is necessary), the ability to have flexible and irregular data rates (i.e., the ability to transmit data only when available and necessary); and an ability to cover a wide range of rates (e.g., from 0 MHz up to 500 MHz).

Figure 4B:
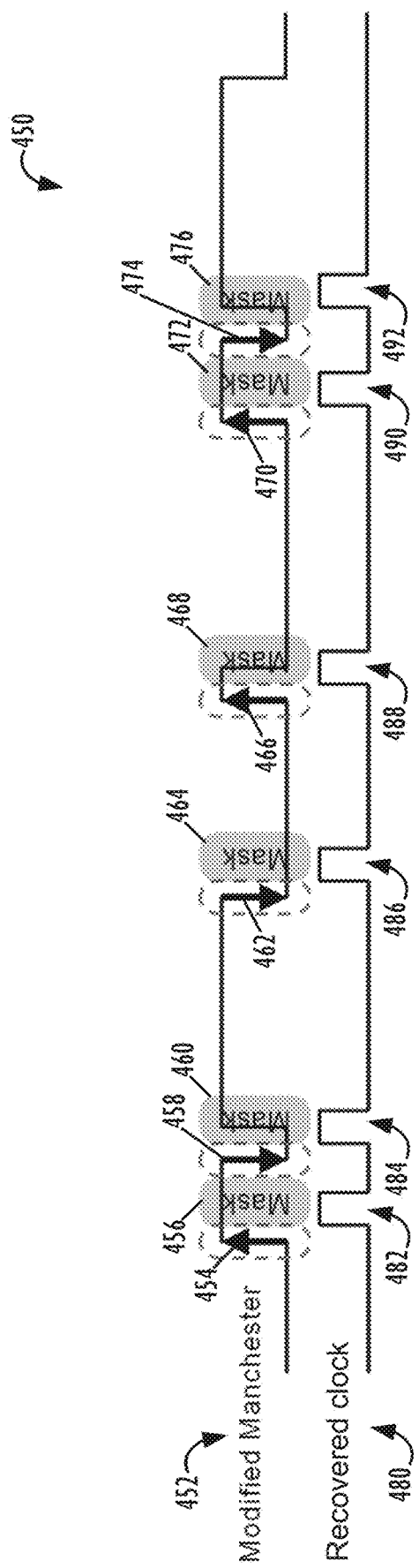
FIG. 4B shows an example of a modified Manchester encoded signal having a dynamic link rate, according to some embodiments.

Turning now to FIG. 4B, an example 450 of a modified Manchester encoded signal having a dynamic link rate is shown, according to some embodiments. As mentioned above with reference to FIG. 4A, the modified Manchester encoding schemes described herein allow for flexible and irregular data rates. Example 450 shows just such a scenario, wherein a modified Manchester-encoded signal 452 has irregularly spaced data bit transitions (e.g., 454, 458, 462, 466, 470, 474), each followed by respective masking periods, during which the middle toggles, if necessary, may take place (e.g., 456, 460, 464, 468, 472, 476). In this example 450, middle toggles are only necessary during masking periods 460, 468, and 476 (i.e., due to the data signal encoding two consecutive bits having the same value).

This also results in a recovered clock signal (also referred to herein as "RXCLK") 480 that is irregular, with each clock pulse (e.g., 482, 484, 486, 488, 490, 492) coinciding with a new data bit that is being transmitted as part of the modified Manchester-encoded signal 452.

Figure 5:
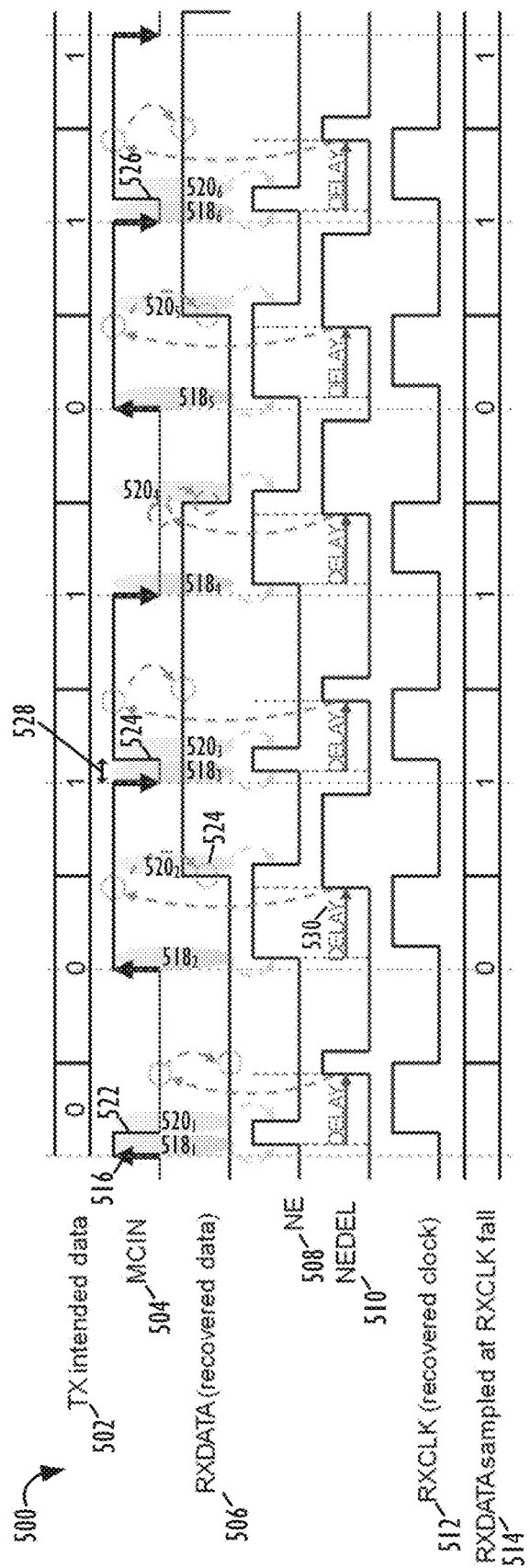
FIG. 5 shows an example of a clock data recovery (CDR) circuit for a modified Manchester encoded signal interface, according to some embodiments.
Figure 5:
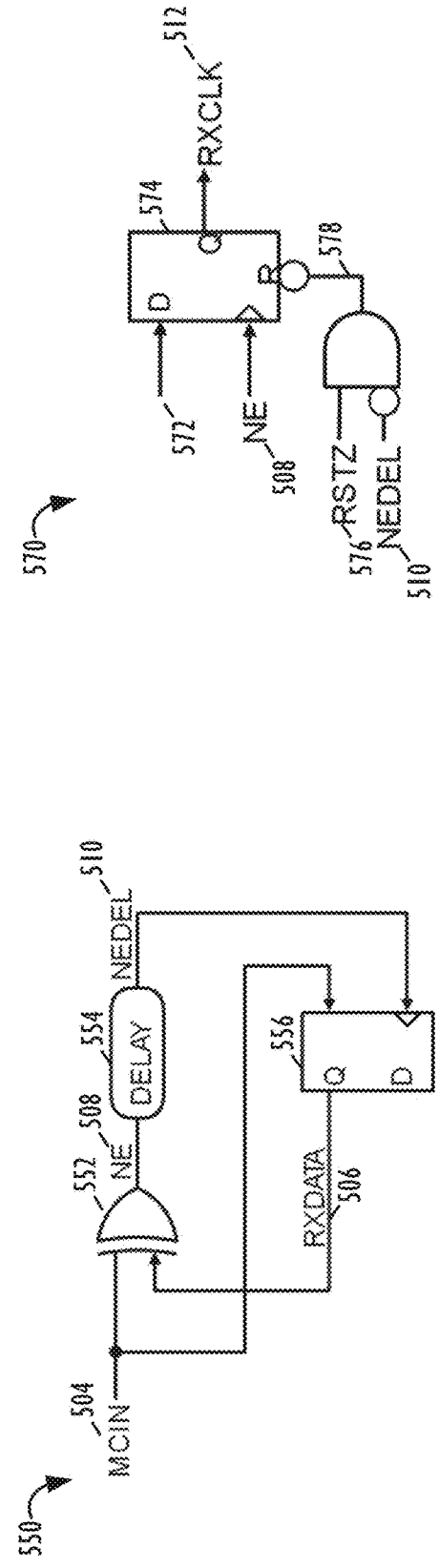

Turning now to FIG. 5, an example of a clock data recovery (CDR) circuit 500 for a modified Manchester encoded signal interface is shown, according to some embodiments. This circuit represents a very compact and efficient design. The array of data bits 502 that the transmitter (TX) intends to send are shown across the top of the signal diagram in FIG. 5. As illustrated, the TX intended data 502 comprises the data bit stream: 0 0 1 1 0 1 1. This is the bit stream that is to be received by the receiver (RX), as illustrated by the "RXDATA sampled at RXCLK fall" data bit array 514. The modified Manchester signal that will encode this intended data bit stream is shown at signal 504 (MCIN). The recovered data (RXDATA) signal itself is shown at 506.

As will be explained in further detail below, a so-called "Not Equal" (NE) signal that is the output of a comparator (e.g., an XOR gate) is shown at 508, and a delayed version of NE signal 508 is shown as NEDEL signal 510 (i.e., with each rise in the NEDEL signal 510 delayed from the corresponding rise in the NE signal 508 by a delay period 530). According to some CDR embodiments, the rising edge of the NEDEL signal 510 may be used as a "clock signal" to sample the MCIN data signal 504. Finally, an exemplary recovered clock signal (RXCLK) 512 is shown. As will be described in greater detail with reference to circuit 570, the recovered clock signal 512 may be reshaped, if so desired by a given implementation, such that the recovered clock signal 512 has a constant duty cycle (i.e., as opposed to the potentially irregular duty cycles of the NE (508) and NEDEL (510) signals). In other embodiments, the NE signal 508 (or the NEDEL signal 510) can be used directly as the RXCLK signal 512, i.e., a RXCLK shaping circuit is not necessary, e.g., if the pulse width variation is not an issue for a particular embodiment.

Returning to exemplary MCIN signal 504, it is illustrated that the first transition is a low-to-high transition in the signal at 516, indicating that the first encoded data bit has a value of '0,' according to this encoding scheme. Shaded region $518_1$ represents the time period at which the first data bit in the intended data signal 502 causes the NE signal 508 to become asserted (i.e., the current value of the MCIN signal 504 is no longer equal to the previous state of the RXDATA signal 506). In some embodiments, the previous state of the RXDATA signal 506 may be stored in a flipflop 556, as will be described in greater detail below with reference to circuit 550. In the example 500, the MCIN signal 504 has gone high at 516, while the RXDATA signal 506 is still low. Corresponding shaded region $520_1$ represents the time period at which the NE signal 508 is again non-asserted (i.e., has gone low) for the first data bit, i.e., because the RXDATA signal 506 and the MCIN signal 504 are again in agreement (i.e., are equal to each other again).

As may now be understood, shaded region $518_n$ represents the time period at which the $n^{th}$ data bit in the intended data signal 502 causes the NE signal 508 to become asserted, and the corresponding shaded region $520_n$ represents the time period after which the $n^{th}$ data bit in the intended data signal 502 causes the NE signal 508 to become non-asserted.

Turning now to exemplary CDR circuit 550, it is illustrated that the current state of the MCIN signal 504 and the stored state of the RXDATA signal 506 enter a comparator 552 (e.g., as implemented with an XOR gate) that outputs a logical high value only when the two input signals, i.e., 504 and 506, are not currently equal to one another. The output of this comparator 552 corresponds to the NE signal 508, as discussed above.

In some embodiments, the NE signal 508 may be passed through a delay chain 554 (e.g., a simple analog delay comprised of a chain of inverters, in some embodiments), resulting in the NEDEL signal 510, as discussed above, whose rising edge may be used as a sort of "clock signal" to sample the MCIN data signal 504, i.e., when the NEDEL signal 510 becomes asserted, the current value of the MCIN signal 504 is stored into the flipflop 556 and held there until the NEDEL signal 510 again has a rising edge.

Because the rising edge of the NEDEL signal 510 happens when the MCIN data signal 504 is "stable," i.e., long after any "preparation toggle" (e.g., preparation toggles 522, 524, and 526 in the example 500) may have happened in the MCIN data signal 504, the preparation toggle is effectively ignored by the RX CDR circuit—as it should be in order for the data to be accurately recovered by the RX. Another advantage of the delayed signal is that any noise transitions occurring between the preparation toggle and the RXDATA sampling do not impact the sampled value of RXDATA, thus providing improved noise immunity for the CDR circuit. The longer the noise immune period of the CDR circuit, the higher the circuit's performance will be. The design of CDR circuit 550 also advantageously allows the TX to stretch (or shorten) the data period between bits as much (or as little) as it needs to when there is new data transmit to the RX end.

As may now be appreciated, CDR circuit 550 is an example of a decoder circuit that is configured to receive an encoded data signal (504) comprising: boundary transitions (e.g., 516) that indicate a current state of the encoded data signal; and mid-bit transitions (e.g., 522) that occur between any two consecutive states in the encoded data signal having the same value, wherein the mid-bit transitions occur after a fixed first time-interval (e.g., as shown at exemplary interval 528) after the boundary transitions; generate a non-equal (NE) signal (508) based on a comparison between a current state of the encoded data signal (504) with a state preceding the current state of the encoded data signal (506); delay the NE signal by a second time interval that is greater than the fixed first time-interval (510); and sample a state of the encoded data signal using the delayed NE signal (as shown at flipflop 556 being sampled by NEDEL signal 510).

As described above, in some embodiments, it may be desirable to for the recovered clock signal (RXCLK) 512 to have a constant duty cycle. In such cases, a circuit such as exemplary RXCLK shaping circuit 570 may be employed. In some such embodiments, RXCLK shaping circuit 570 may comprise a flipflop 574, whose inputs are a logical high signal 572 and the NE signal 508, and whose output is the reshaped recovered clock signal (RXCLK) 512. The reset pin of the flipflop may be connected to a signal 578, which is effectively the negation of the output of an AND gate that is fed by RSTZ signal 576 (i.e., a low-active reset signal, which may be a power-on-reset or a hardware reset signal from a pin, or the like) and the negation of the NEDEL signal 510.

Negative Hold CDR Circuit

Figure 6:
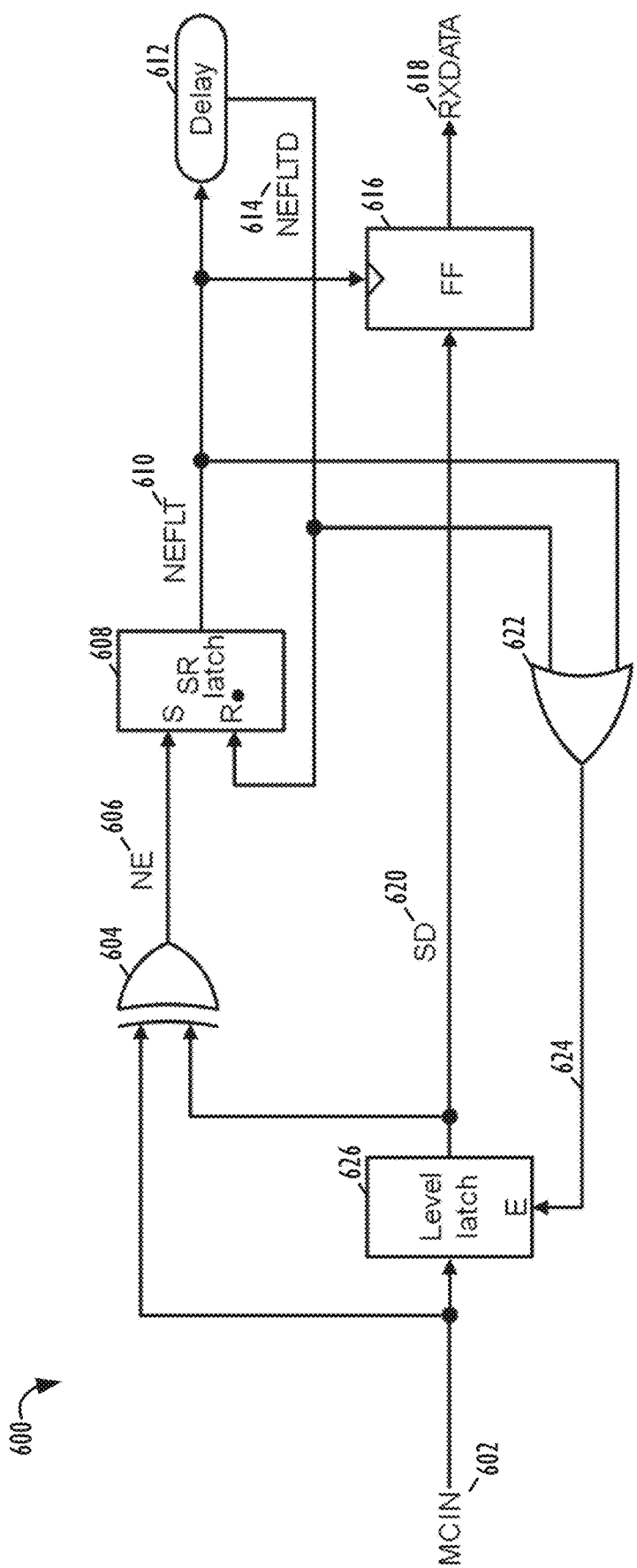
FIG. 6 shows an example of a negative hold CDR circuit for a modified Manchester encoded signal interface, according to some embodiments.

Turning now to FIG. 6, an example of a so-called "negative hold" CDR circuit 600 for a modified Manchester encoded signal interface is shown, according to some embodiments. The incoming Manchester-encoded data signal (MCIN 602) is fed into the XOR gate 604 and the level latch 626. The XOR gate 604 essentially serves as a comparator or "not equal" function, i.e., that outputs a NE signal 606 that has a logical high value when the MCIN 602 signal and the output of the level latch 626 are not equal to each other.

The NE signal 606 generated by the XOR gate 604 of circuit 600 serves an analogous role as the comparators in prior art CDR circuit implementations that take as input two set of two or more bus inputs. By contrast with the prior art, circuit 600 is able to operate on a singular input signal, i.e., input signal MCIN 602. The single input signal MCIN 602 may comprise an output signal of either a differential receiver that translates differential voltage between two input pins or a single-ended receiver (or be received directly from a pad of the device).

NE signal 606 is then connected to the set pin of an SR latch 608, whose output is an NEFLT signal 610. The NEFLT signal 610 is then pushed through a delay chain 612, which results in a NEFLTD signal 614, which is connected to the reset pin of the SR latch 608. SR latch 608 has a S (set) input that is connected to NE signal 606, while the R (reset) input (with higher priority over the S input) is connected to the NEFLTD signal 614. Thus, when NE signal 606 becomes high (and, thus, the S input of the SR latch 608 becomes 1) and the NEFLTD signal 614 is low (i.e., the R input of the SR latch 608 is 0), the SR latch 608 sets its output NEFLT signal 610 to 1, and NEFLT signal 610 remains 1—even after the S input (i.e., NE signal 606) becomes 0, i.e., for as long as the R input remains 0.

The NEFLTD signal 614 becomes 1 a fixed delay of time (i.e., as imparted by 612) after the NEFLT signal 610 becomes 1, i.e., the R input of the SR latch 608 becomes 1, thereby resetting its output, NEFLT signal 610, to a value of 0—regardless of the value of its S input state (i.e., NE signal 606). The NEFLTD signal 614 then becomes 0 after a fixed delay of time (i.e., as imparted by 612) after NEFLT becomes 0, i.e., the R input of the SR latch 608 becomes 0, thereby releasing the SR latch 608 from its reset state and allowing NEFLT signal 610 to be set to 1 again, i.e., once the S input becomes 1 again.

The value of NE signal 606 is high when the current MCIN state 602 and the previous MCIN signal state, i.e., stored data (SD) signal 620, stored in a storage component (e.g., level latch 626) are not equal, and the value of NE signal 606 is low when the SD signal state 620 becomes equal to MCIN state 602, that is, when the storage component (e.g., level latch 626) is enabled by an input signal, EN 624, and passes MCIN state 602 through the storage component 626 to be the new SD signal state 620. The storage component 626 latches the MCIN state 602 to the SD state 620 when EN signal 624 becomes 0, and the SD signal state 620 remains constant while EN signal 624 remains 0.

The NEFLT signal 610 is also used to trigger a flipflop 616, which samples the output of level latch 626 (i.e., the current state of SD signal 620) to be output as the RXDATA signal 618. The NEFLT signal 610 is also used as one of two inputs (i.e., along with the NEFLTD signal 614) to an OR gate 622, such that enable signal 624 for level latch 626 is asserted when either (or both) of the inputs to OR gate 622 are asserted.

One effect of circuit 600 is that a shorter delay period may be used as compared to the circuit 550 of FIG. 5, which consumes less power. Another effect is that a greater portion of the unit interval (UI) is masked by the SR latch 608, thereby providing stronger immunity to signal noise. As mentioned above, in some embodiments, giving the R (reset) input of SR latch 608 a higher priority over the S (set) input (i.e., if both R and S are high, then the R input will be controlling) may also improve the noise immunity of the circuit.

As may now be appreciated, negative hold CDR circuit 600 is an example of a CDR circuit, including: a single input for inputting an input signal (MCIN 602); a level latch (626) that stores the input signal (MCIN) and outputs a stored data (SD) signal (620); an XOR gate (604) that determines an inequality between the input signal (MCIN) and the SD signal and that outputs a not-equal (NE) signal (606); a set-reset (S-R) latch (608) that sets (and holds) the NE signal, outputs an NEFLT signal (610), and is reset by a delayed version of the NEFLT signal (e.g., NEFLTD signal 614); a delay circuit (612) that delays the NEFLT signal and outputs the NEFLTD signal; an OR gate (622) that determines a maximum between the NEFLT signal (610) and the NEFLTD signal (614), and outputs an EN signal (624) that enables the level latch (626); and a flip-flop (616) that stores the SD signal and outputs a received data (RXDATA) signal (618), wherein the flip-flop is sampled by the NEFLT signal (610).

Transmitter Circuit Signal Diagrams for Modified Manchester Encoding

Figure 7:
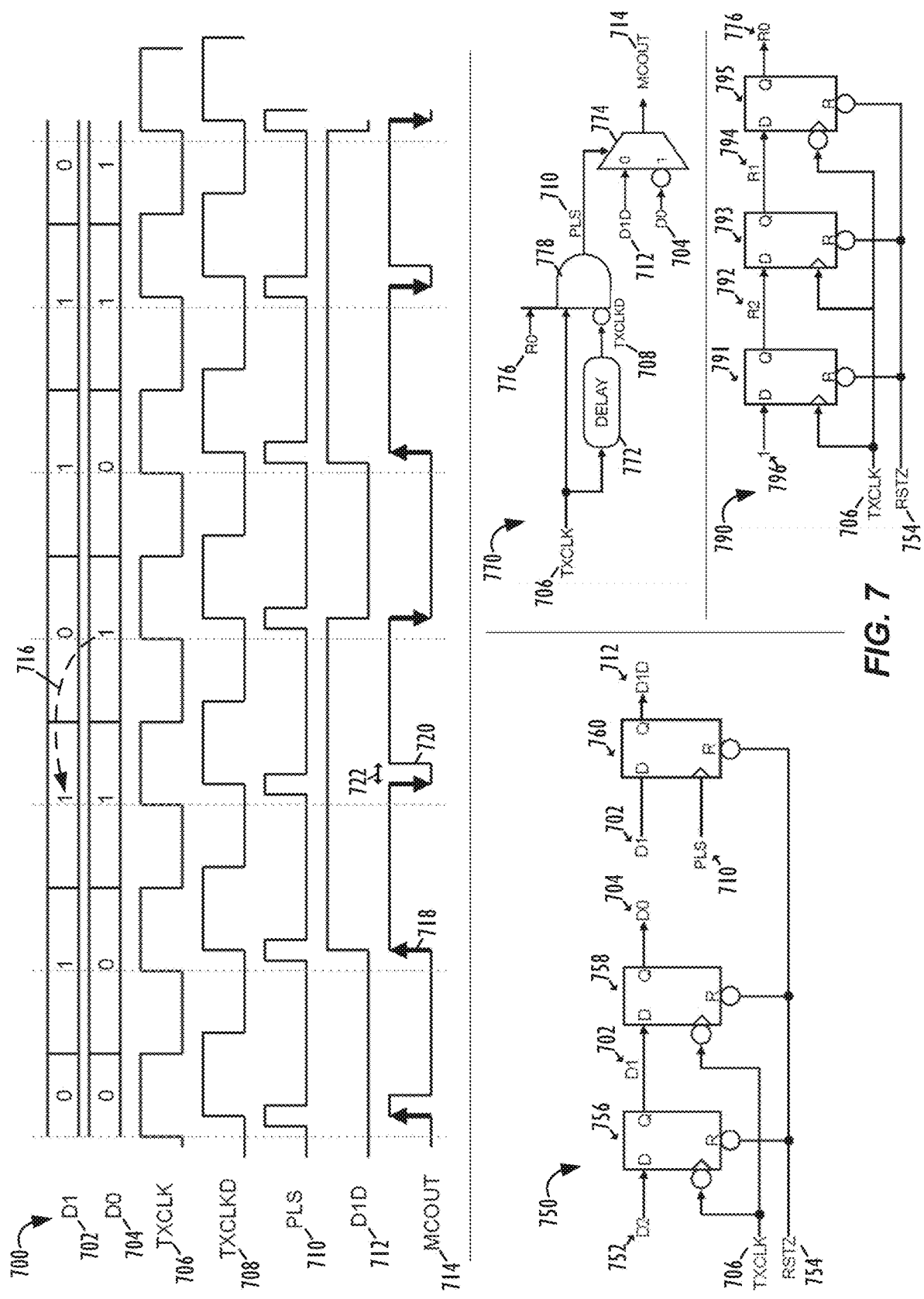
FIG. 7 shows an example of a transmitter circuit for a modified Manchester encoded signal interface, according to some embodiments.

Turning now to FIG. 7, an example 700 of a transmitter circuit for a modified Manchester encoded signal interface is shown, according to some embodiments. In the signal diagram of example 700, signal D0 704 represents a stream of the values of the "current" data bit being transmitted (i.e., the last bit of the shift register), while signal D1 702 represents the "next" data bit that is to be transmitted (i.e., one bit prior to the last bit of the shift register). Arrow 716 illustrates this relationship between D0 and D1 visually, i.e., the values in the D0 shift register follow an identical sequence to the values in the D1 register—but are shifted by one bit position to the right.

The TXCLK signal 706 represents the TX-side system clock, while the TXCLKD (i.e., delayed clock) signal 708 represents a delayed version of TXCLK signal 706. The TXCLK signal 706 and TXCLKD signal 708 are used to generate a one-shot pulse (PLS) signal 710 that rises whenever TXCLK is high but TSCLKD is still low (subject to the value of reset signal R0 776 also being high, as will be discussed in further detail below).

The pulse (PLS) signal 710 is used at the last stage for flipflop 760 in shift register circuit 750 and as the selection input to mux 774 (as will be described in further detail with reference to circuit 770), i.e., providing a selection between setting the value of the MCOUT signal 714 to be either D1D 712 (i.e., when PLS is low) or the opposite of the value of D0 704 (i.e., when PLS is high). As may now be appreciated, the signal D1D 712 represents the same value as signal D1 702 but synchronized with the PLS signal 710 timing, i.e., because the mux 774 is controlled by the PLS signal 710.

In the example transmitter circuit 700, the state of the MCOUT signal 714 needs to be prepared, depending on the value of the next data bit that is to be transmitted (i.e., D1). For example, if the next data bit to be transmitted is a '0,' then the MCOUT signal 714 will need to be rising, so the preparatory state has to be a '0' signal value. Similarly, if the next data bit to be transmitted is a '1,' then the MCOUT signal 714 will need to be falling, so the preparatory state has to be a '1' signal value. In other words, the MCOUT signal 714 will always need to be ready for the next transition that it needs to do.

In the exemplary Table 1, below, the possible value pairings of D0 704 and D1 702 are shown in the two left-hand columns, with the corresponding values of the MCOUT signal 714 when the PLS signal 710 is high (i.e., reflecting the opposite of the value of the D0 signal) or when the PLS signal 710 is low (i.e., reflecting the value of the D1D signal 712) shown in the two right hand columns.

TABLE 1

| | | MCOUT | |
|---|---|---|---|
| D0 | D1 | PLS (HIGH) (= !D0) | PLS (LOW) (= D1D) |
| 0 | 0 | 1 | 0 |
| 0 | 1 | 1 | 1 |

TABLE 1-continued

| | | MCOUT | |
|---|---|---|---|
| D0 | D1 | PLS (HIGH) (= !D0) | PLS (LOW) (= D1D) |
| 1 | 0 | 0 | 0 |
| 1 | 1 | 0 | 1 |

Shift register circuit 750 shows an exemplary two flipflop shift register, which may be used to convert parallel data streams into a serial data bit stream. TXCLK signal 706 is used to clock the flipflops 756 and 758, and RSTZ signal 754 is used as the reset signal for the flipflops 756/758/760. As may be understood, circuit 750 can take multiple data bit values in parallel (e.g., bit D0 704, bit D1 702, and bit D2 752) and use the flipflops to convert them into a serialized data bit stream, e.g., transmitting bit D0 704, followed by bit D1 702, followed by bit D2 752. As mentioned above, the last stage for flipflop 760 utilizes PLS signal 710 to output a signal D1D 712 that represents the same value as signal D1 702 but that is synchronized with the PLS signal 710 timing.

MCOUT generation circuit 770 may use a delay chain 772 to produce a delayed version of TXCLK signal 706, labeled as TXCLKD signal 708. As described above, TXCLK signal 706 and TXCLKD signal 708 are used, along with reset signal R0 776 (e.g., by each being passed to an AND gate 778), to generate the PLS signal 710, which may be used as the selection input to mux 774, i.e., providing a selection between setting the value of the MCOUT signal 714 to be either D1D 712 (i.e., when PLS is low) or the opposite of the value of D0 704 (i.e., when PLS is high).

Reset shift register circuit 790 may be used to produce the aforementioned reset signal R0 776. In particular, circuit 790 may be useful, as it prevents the transmission of extra '0' bits on the MCOUT signal 714 after a hardware reset release. As illustrated in FIG. 7, the starting point of circuit 790 is a fixed high or '1' signal 796 (e.g., $V_{DD}$) coming into a first stage flipflop 791, which is clocked by TXCLK signal 706 and reset by the inverse of RSTZ signal 754. R2 signal 792 is set one stage after the reset signal 754 is released. In other words, R2 signal 792 is low by default, but, after the reset signal is released, R2 signal 792 goes high at the rising of TXCLK signal 706. However, R1 signal 794 (which is the output of a second stage flipflop 793 that is also clocked by TXCLK signal 706 and reset by the inverse of RSTZ signal 754) stays low until the second rising of the TXCLK signal 706, then R1 signal 794 goes high, and then, finally, the R0 signal 776 (which is the output of a third stage flipflop 795 that is clocked by the inverse of TXCLK signal 706 and reset by the inverse of RSTZ signal 754) goes high at the following falling of TXCLK signal 706. As may be understood, circuit 790 creates a staggered rising edge, such that the PLS signal 710 (as shown in circuit 770) cannot go high until the R0 signal 776 eventually goes high. As mentioned above, employing a circuit such as circuit 790 has the beneficial effect of preventing the transmission of unwanted extra zeroes on the MCOUT signal 714 after a hardware reset.

Figure 8:
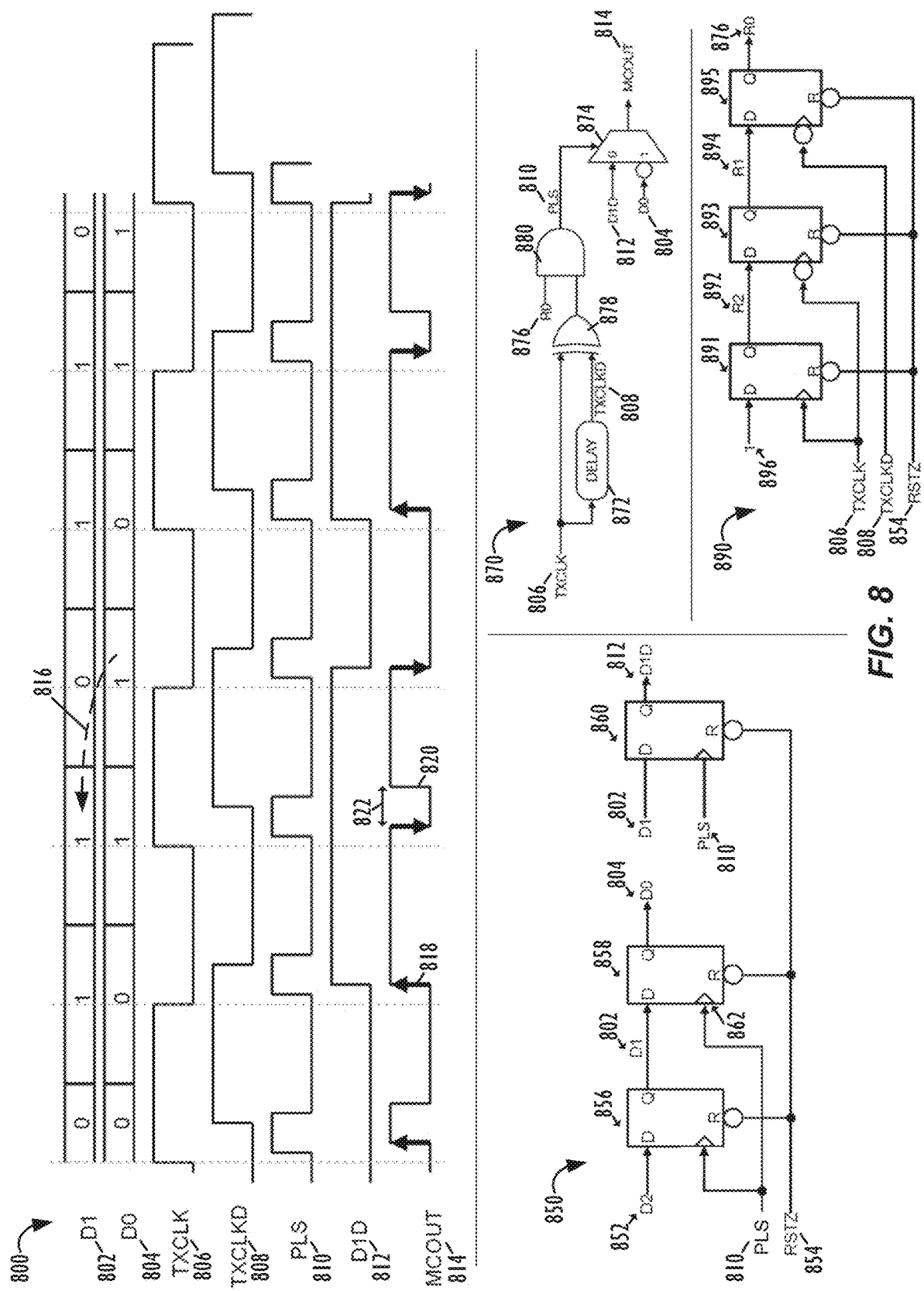
FIG. 8 shows an example of a transmitter circuit for a modified Manchester encoded signal interface with a double data rate (DDR) transmitter clock signal, according to some embodiments.

Turning now to FIG. 8, an example 800 of a transmitter circuit for a modified Manchester encoded signal interface with a double data rate (DDR) transmitter clock signal is shown, according to some embodiments. All elements numbered 8xx in FIG. 8 are analogous to (and play analogous roles to) their corresponding counterpart elements numbered 7xx and described above with reference to FIG. 7, except where otherwise noted in the FIG. 8 description below.

As noted above, one distinction between FIG. 8 and FIG. 7 is that FIG. 8 illustrates a DDR transmitter clock signal (TXCLK) 806 (and, by extension, a DDR delayed transmitted clock signal TXCLKD 808), that is, the DDR transmitter transfers data on both the rising and falling edges of the clock signal. This is also shown in the PLS signal 810, which, in FIG. 8, goes high at both the rising and falling edges of the TXCLK signal 806 (as opposed to in FIG. 7, wherein data was only transferred on the rising edges of the clock signal, as reflected by PLS signal 710). Another distinction in the shift register circuit 850 of FIG. 8 with the shift register circuit 750 of FIG. 7 is that the trigger/clock input for the flipflops is the PLS signal 810, rather than the TXCLK signal 706.

In some embodiments, analogous circuits to MCOUT generation circuit 770 and reset shift register circuit 790 of FIG. 7 may also be used in the transmitter circuit example of FIG. 8, as illustrated in MCOUT generation circuit 870 and reset shift register circuit 890, respectively, of FIG. 8.

MCOUT generation circuit 870 may use a delay chain 872 to produce a delayed version of TXCLK signal 806, labeled as TXCLKD signal 808. As described above, TXCLK signal 806 and TXCLKD signal 808 are used (along with reset signal R0 876) to generate the PLS signal 810, which may be used as the selection input to mux 874, i.e., providing a selection between setting the value of the MCOUT signal 814 to be either D1D 812 (i.e., when PLS is low) or the opposite of the value of D0 804 (i.e., when PLS is high). One difference between MCOUT generation circuit 770 and MCOUT generation circuit 870 is that MCOUT generation circuit 870 employs a comparator (e.g., XOR gate 878) to the TXCLK signal 806 and TXCLKD signal 808, whose output is then passed to an AND gate (880) along with R0 signal 876, in order to determine the state of PLS signal 810. As explained above, R0 signal 876 is a reset signal that is released at the first bit of the transmitted signal, so that MCOUT 814 will not have unintended zeroes after the release of RSTZ signal 854.

Reset shift register circuit 890 may be used to produce the aforementioned reset signal R0 876. As illustrated in FIG. 8, the starting point of circuit 890 is a fixed high or '1' signal 896 (e.g., $V_{DD}$) coming into a first stage flipflop 891, which is clocked by TXCLK signal 806 and reset by the inverse of RSTZ signal 854. R2 signal 892 is set one stage after the reset signal 854 is released. In other words, R2 signal 892 is low by default, but, after the reset signal is released, R2 signal 892 goes high at the rising of TXCLK signal 806. However, R1 signal 894 (which is the output of a second stage flipflop 893 that is clocked by the inverse of TXCLK signal 806 and reset by the inverse of RSTZ signal 854) stays low until the following falling of the TXCLK signal 806, then R1 signal 894 goes high, and then, finally, the R0 signal 876 (which is the output of a third stage flipflop 895 that is clocked by the inverse of TXCLKD signal 808 and reset by the inverse of RSTZ signal 854) goes high at the following falling of TXCLKD signal 808. As may be understood, circuit 890 creates a staggered rising edge, such that the PLS signal 810 (as shown in circuit 870) cannot go high until the R0 signal 876 eventually goes high. As mentioned above, employing a circuit such as circuit 890 has the beneficial effect of preventing the transmission of unwanted extra zeroes on the MCOUT signal 814 after a hardware reset.

One advantage of the DDR circuit of FIG. 8, i.e., as compared to FIG. 7, is that the TXCLK signal in FIG. 8 can actually be driven at half the data rate, thus making it a more power-efficient circuit design.

As may now be appreciated, FIG. 7 and FIG. 8 illustrate examples of transmitter (TX) circuits configured to encode a data signal into an encoded data signal, the encoded data signal (e.g., 714/814) comprising boundary transitions (e.g., 718/818) that indicate a current state of the encoded data signal; and mid-bit transitions (e.g., 720/820) that occur between any two consecutive states in the encoded data signal having the same value, wherein the mid-bit transitions occur at a fixed first time-interval (e.g., 722/822) after the boundary transitions. As mentioned above, the fixed first time-interval may be independent of the link rate of the encoded data signal and, in some cases, may be chosen to be the shortest possible value for a physical channel that is used for the encoded data signal.

Alternative Transmitter Circuit for Modified Manchester Encoding

According to some embodiments, the generation of a pulse (PLS) signal with accurate pulse width and using an analog delay may become too costly for the circuit to be able to operate practically. In such cases, a double data rate (DDR) serializer, e.g., with a 1.0× or 1.5× rate clock may be a preferable implementation.

For example, in the case of a 1.0× serializer, a shift register may be produced, storing two values for each clock cycle corresponding to a data bit D0 to be transmitted (i.e., one bit in the shift register corresponding to the high portion of the clock signal cycle and one bit in the shift register corresponding to the low portion of the clock signal cycle), wherein the bits in the shift register correspond to the value of the MCOUT signal needed to encode the data bits D0 that the TX intends to transmit.

By contrast, in the case of a 1.5× serializer, a more granular shift register may be produced, storing three values for each one-and-a-half clock cycles corresponding to a data bit D0 to be transmitted (i.e., one bit in the shift register corresponding to the high portion of the first clock signal cycle, one bit in the shift register corresponding to the low portion of the first clock signal cycle, and one bit in the shift register corresponding to the high portion of the second clock signal cycle), wherein the bits in the shift register again correspond to the value of the MCOUT signal needed to encode the data bits D0 that the TX intends to transmit.

According to the modified Manchester encoding techniques described herein, using the techniques described above regarding a serializer circuit implemented with a shift register, the receiver circuit would still need to know what portions of the signal to "mask" out, so that it did not accidentally sample the incoming data before (or during) a preparation toggle in the signal. For example, in the 1.0× serializer example above, the preparation toggle will occur exactly in the middle (i.e., 50% of the UI) of the clock cycle period, since the shift register is representing the MCOUT signal with only two bits of granularity per clock cycle. By contrast, in the 1.5× serializer example above, the preparation toggle may occur one-third of the way (i.e., 33% of the UI) through the clock cycle period, since the shift register is representing the MCOUT signal with three bits of granularity per clock cycle.

It is also noted that, in most modified Manchester encoding schemes, the TX and RX will not be used at the same time, meaning that the analog delay chain of the RX can be shared with the TX, thus obviating the need to use a shift register-based TX scheme, such as described immediately above.

CONCLUSIONS

Although the aspects above have been described in considerable detail, numerous variations and modifications will become apparent to those skilled in the art once the above disclosure is fully appreciated. It is intended that the following claims be interpreted to embrace all such variations and modifications.

The invention claimed is:

1. A modified Manchester decoder circuit, comprising: an encoded data signal input; at least one storage component; and a clock data recovery (CDR) circuit configured to recover a data signal from an encoded data signal, wherein the decoder circuit is configured to:
  receive an encoded data signal, the encoded data signal comprising:
    boundary transitions that indicate a current state of the encoded data signal; and
    mid-bit transitions that occur between any two consecutive states in the encoded data signal having a same value, wherein the mid-bit transitions occur after a fixed first time-interval after the boundary transitions;
  generate a non-equal (NE) signal based on a comparison between a current state of the encoded data signal with a state preceding the current state of the encoded data signal;
  delay the NE signal by a second time interval that is greater than the fixed first time-interval;
  sample a state of the encoded data signal using the delayed NE signal to recover the data signal; and
  generate, with the CDR circuit, a recovered clock signal based on the delayed NE signal.

2. The decoder of claim 1, wherein the CDR circuit comprises an XOR gate that generates the NE signal.

3. The decoder of claim 1, wherein the CDR circuit comprises a delay circuit that delays the NE signal.

4. The decoder of claim 3, wherein the delay circuit comprises an inverter chain.

5. The decoder of claim 1, wherein the CDR circuit comprises a flip-flop circuit that stores a state of the encoded data signal and is sampled using the delayed NE signal.

6. The decoder of claim 1, wherein the CDR circuit is further configured to reshape the recovered clock signal to have a constant duty cycle.

7. A clock data recovery (CDR) circuit, including:
  a single input for inputting an input signal (MCIN);
  a level latch that stores the input signal (MCIN) and outputs a stored data (SD) signal;
  an XOR gate that determines an inequality between the input signal (MCIN) and the SD signal and that outputs a not-equal (NE) signal;
  a set-reset (S-R) latch that sets the NE signal, outputs a noise-filtered version of the NE signal (NEFLT signal), and is reset by a delayed version of the NEFLT signal (NEFLTD signal);
  a delay circuit that delays the NEFLT signal and outputs the NEFLTD signal;
  an OR gate that determines a maximum between the NEFLT signal and the NEFLTD signal, and outputs an EN signal that enables the level latch; and
  a flip-flop that stores the SD signal and outputs a received data (RXDATA) signal, wherein the flip-flop is sampled by the NEFLT signal.

8. A method for decoding a data signal, comprising:
  receiving an encoded data signal, wherein the encoded data signal comprises:
    boundary transitions that indicate a current state of the encoded data signal; and
    mid-bit transitions that occur between any two consecutive states in the encoded data signal having a same value, wherein the mid-bit transitions occur after a fixed first time-interval after the boundary transitions;
  ignoring any transitions in the encoded data signal for a period of time long enough not to sense the mid-bit transitions; and
  sensing states of the encoded data signal based on the boundary transitions.

9. The method of claim 8, further comprising: generating a clock signal based on sensing the boundary transitions.

10. The method of claim 8, wherein each period of time during which any transitions are ignored begins after a boundary transition.

11. The method of claim 8, wherein sensing the states of the encoded data signal occurs at an end of a unit interval (UI).

12. The method of claim 8, wherein the data signal is encoded by an encoder, and wherein the encoded data signal is transmitted from the encoder to a decoder.

13. The method of claim 12, wherein the decoder performs the steps of: generating a NE signal; delaying the NE signal; and sensing states of the encoded data signal using the delayed NE signal.

14. The method of claim 12, wherein the encoder is part of an event camera system, and wherein the decoder is part of a system on a chip (SoC).

* * * * *